United States Patent
Beerling et al.

[11] Patent Number: 6,123,410
[45] Date of Patent: Sep. 26, 2000

[54] SCALABLE WIDE-ARRAY INKJET PRINTHEAD AND METHOD FOR FABRICATING SAME

[75] Inventors: Timothy E. Beerling; Timothy L. Weber; Melissa D. Boyd, all of Corvallis, Oreg.

[73] Assignee: Hewlett-Packard Company, Palo Alto, Calif.

[21] Appl. No.: 08/959,376

[22] Filed: Oct. 28, 1997

[51] Int. Cl.$^7$ .................................. B41J 2/155; B41J 2/05

[52] U.S. Cl. ................................................ 347/42; 347/42

[58] Field of Search ................................ 347/42, 59, 13, 347/40, 58, 69

[56] References Cited

U.S. PATENT DOCUMENTS

| | | | |
|---|---|---|---|
| 4,789,425 | 12/1988 | Drake et al. | 156/644 |
| 4,791,440 | 12/1988 | Eldridge et al. | 347/53 |
| 4,917,286 | 4/1990 | Pollacek | 228/110 |
| 5,016,023 | 5/1991 | Chan et al. | 346/1.1 |
| 5,057,854 | 10/1991 | Pond et al. | 347/42 |
| 5,148,595 | 9/1992 | Doggett et al. | 29/840 |
| 5,160,945 | 11/1992 | Drake | 347/42 |
| 5,227,812 | 7/1993 | Watanabe et al. | 347/50 |
| 5,469,199 | 11/1995 | Allen et al. | 347/42 |
| 5,469,201 | 11/1995 | Erickson et al. | 347/85 |
| 5,598,196 | 1/1997 | Braun | 347/68 |
| 5,617,131 | 4/1997 | Murano et al. | 347/233 |
| 5,643,353 | 7/1997 | Wallace et al. | 75/331 |

FOREIGN PATENT DOCUMENTS

| | | | |
|---|---|---|---|
| 0289347A2 | 11/1988 | European Pat. Off. | B41J 3/04 |
| 0430692A1 | 6/1991 | European Pat. Off. | B41J 2/05 |
| 0666174A2 | 8/1995 | European Pat. Off. | B41J 2/14 |
| 0668167A2 | 8/1995 | European Pat. Off. | B41J 25/34 |
| 0710560A2 | 5/1996 | European Pat. Off. | B41J 2/05 |
| 04173262 | 6/1992 | Japan | B41J 2/345 |

OTHER PUBLICATIONS

Imler, Scholz, Cobarruviaz, Nagesh, Chaw, Haitz, "Precision Flip–Chip Solder Bump Interconnects for Optical Packaging", IEEE Transactions on Components, Hybrids, and Manufacturing Tech., vol. 15, #6, 1992, pp. 997–982.

Itoh, Sasaki, Uda, Yoneda, Honmou, Fukushima, "Use of AuSn Solder Bumps in Three–dimensional Passive Aligned Packaging of LD/PD Arrays on Si Optical Benches", IEEE Electronic Components and Technology Conf., 1996, pp. 1–7.

Deshmukh, Brady, Roll, King, Shmulovic, Zolonowski, "Active Atmosphere Solder Self–Alignment and Bonding of Optical Components", Intl. Journal of Microcircuits and Electronic Packaging, vol. 16, #2, 1993, pp. 97–107.

Ludwig, "Multilayered focal plane structures with self–aligning detector assembly", Infrared Readout Electronics III, SPIE, vol. 2745, 1996, pp. 149–158.

Kallmayer, Oppenmann, Kloesen, Zakel, Reichl, "Experimental Results on the Self–Alignment Process Using Au/Sn Metallurgy and on the Growth of the C–Phase During the Reflow," Flip Chip, BGA, TAB & AP Symposium, 1995, pp. 225–236.

Linder, Baltes, Gnaedinger, Doering, "Photolithography in Anistropically Etched Grooves", IEEE 9th Intl. Workshop on MEMS, 1996, pp. 38–43.

*Primary Examiner*—John Barlow
*Assistant Examiner*—Michael S Brooke

[57] ABSTRACT

A scalable wide-array printhead is formed by mounting multiple thermal inkjet printheads to a carrier substrate. The printheads are mounted to one face and logic ICs and drive ICs are mounted to an opposite face. Interconnects are formed through the carrier substrate to electrically couple the printheads to the logic ICs and drive ICs. The carrier substrate is formed of silicon and etched to define ink refill slots. A solder bump mounting process is used to mount the printheads to the carrier substrate. Such process serves to align each of the printheads. The solder forms a fluidic boundary around a printhead ink slot.

13 Claims, 5 Drawing Sheets

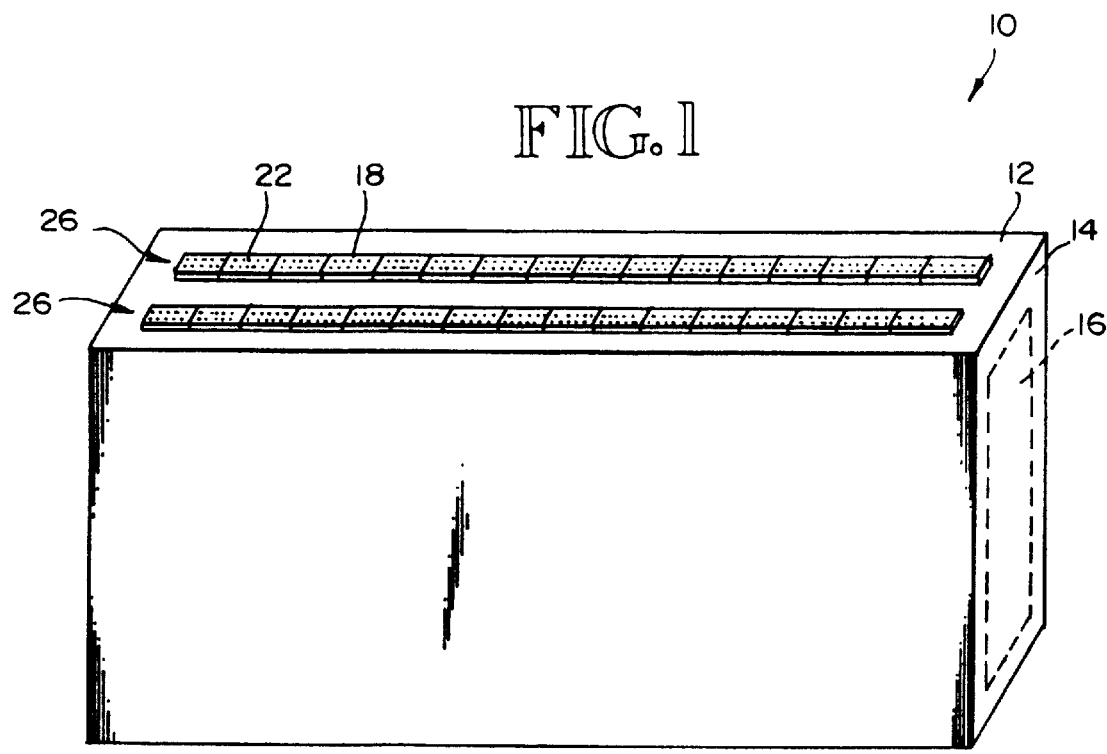
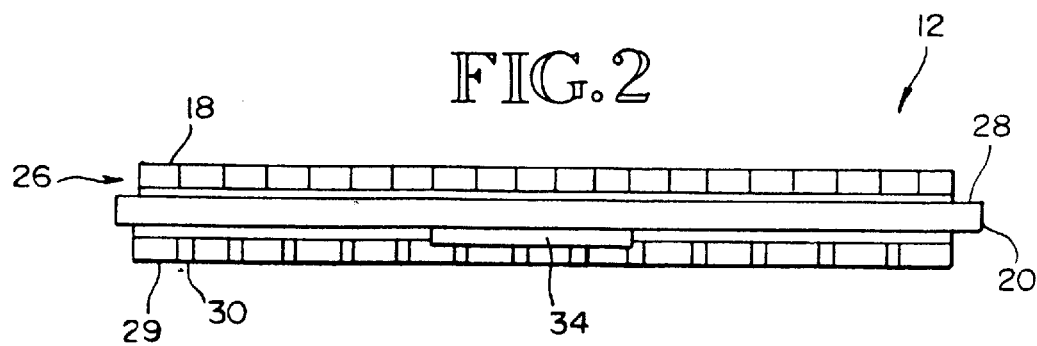

SCALABLE WIDE-ARRAY INKJET PRINTHEAD AND METHOD FOR FABRICATING SAME

BACKGROUND OF THE INVENTION

This invention relates generally to inkjet printhead construction, and more particularly, to a wide-array inkjet printhead construction.

There are known and available commercial printing devices such as computer printers, graphics plotters and facsimile machines which employ inkjet technology, such as an inkjet pen. An inkjet pen typically includes an ink reservoir and an array of inkjet printing elements, referred to as nozzles. The array of printing elements is formed on a printhead. Each printing element includes a nozzle chamber, a firing resistor and a nozzle opening. Ink is stored in an ink reservoir and passively loaded into respective firing chambers of the printhead via an ink refill channel and ink feed channels. Capillary action moves the ink from the reservoir through the refill channel and ink feed channels into the respective firing chambers. Conventionally, the printing elements are formed on a common substrate.

For a given printing element to eject ink a drive signal is output to such element's firing resistor. Printer control circuitry generates control signals which in turn generate drive signals for respective firing resistors. An activated firing resistor heats the surrounding ink within the nozzle chamber causing an expanding vapor bubble to form. The bubble forces ink from the nozzle chamber out the nozzle opening. A nozzle plate adjacent to the barrier layer defines the nozzle openings. The geometry of the nozzle chamber, ink feed channel and nozzle opening defines how quickly a corresponding nozzle chamber is refilled after firing. To achieve high quality printing ink drops or dots are accurately placed at desired locations at designed resolutions. It is known to print at resolutions of 300 dots per inch and 600 dots per inch. Higher resolution also are being sought. There are scanning-type inkjet pens and non-scanning type inkjet pens. A scanning-type inkjet pen includes a printhead having approximately 100–200 printing elements. A non-scanning type inkjet pen includes a wide-array or page-wide-array printhead. A page-wide-array printhead includes more than 5,000 nozzles extending across a pagewidth. Such nozzles are controlled to print one or more lines at a time.

In fabricating wide-array printheads the size of the printhead and the number of nozzles introduce more opportunity for error. Specifically, as the number of nozzles on a substrate increases it becomes more difficult to obtain a desired processing yield during fabrication. Further, it is more difficult to obtain properly sized substrates of the desired material properties as the desired size of the substrate increases.

SUMMARY OF THE INVENTION

According to the invention, a scalable wide-array printhead structure is formed by mounting multiple thermal inkjet printheads to a carrier substrate. Each printhead includes a plurality of printing elements. Each printing element includes a nozzle chamber, a firing resistor and a nozzle opening. In addition respective wiring lines couple each firing resistor to a contact on the printhead. By prescribing a different number of printheads to a carrier substrate for different embodiments, different sized wide-array printhead structure embodiments are achieved. Thus, one advantage of the mounting methodology is that a scalable printhead architecture is achieved.

According to another aspect of the invention, a solder bump mounting process is used to mount the printheads to the carrier substrate. A benefit of such solder bumps is that they serve to align each of the printheads along the carrier substrate. Wetting pads for receiving solder are precisely placed on the carrier substrate and printheads using photolithographic or other accurate processes. Once the solder is placed and heated into a liquid solder reflow occurs. During solder reflow such pads tend to align with each other and thus align the printhead to the carrier substrate.

In one embodiment the printheads include an underlying ink slot along a surface of the printhead facing the carrier substrate. According to another aspect of the invention, the solder for mounting a printhead forms a ring around such ink slot. The solder ring serves as a fluidic boundary for the ink slot. As a result an encapsulant is not required for fluidic isolation of the printhead ink slots.

Contacts for the printheads typically are formed along the same surface as the nozzle openings. According to another aspect of the invention, a front-to-back interconnect is formed through the printhead to interconnect the printhead to the carrier substrate. According to an alternative aspect of the invention a wire bonded interconnect is formed from the printheads contacts to carrier substrate contacts. The wire bonded interconnects extend outside the printhead rather than through it.

According to another aspect of this invention, the carrier substrate does not contain integral devices of active electronic circuits. With regard to electrical features, the carrier substrate merely includes interconnects for electrically coupling the contacts of the respective printheads to logic circuitry and drive circuitry. Because the carrier substrate is not used for active electronic circuits the silicon used can be a lower grade, less expensive silicon. Such silicon is chosen to have a crystalline orientation useful for obtaining a desired ink refill slot profile.

According to another aspect of the invention, logic circuitry and drive circuitry integrated circuit chips are mounted to the carrier substrate and interfaced to the printheads to control the printing elements of the multiple printheads. The carrier substrate with the logic ICs, drive ICs and printheads is referred to herein as the wide-array printhead.

According to another aspect of the invention, the printheads are mounted to one face of the carrier substrate and the logic ICs and drive ICs are mounted to an opposite face of the carrier substrate. Interconnects are formed through the carrier substrate to electrically couple contacts of the printheads to contacts of the logic ICs and drive ICs. A front-to-back metallization process is used to form the interconnects through the carrier substrate.

According to a preferred embodiment, the carrier substrate is formed by the same material as the printhead substrate, (e.g., silicon). An advantage of using the same material for the carrier substrate and printheads is that coefficient of thermal expansion mismatches are avoided. In another embodiment the carrier substrate is formed of a multilayered ceramic material having a coefficient of thermal expansion matched to silicon. The material for the substrate is etched to form an ink refill slot for ink to flow from a reservoir to the printheads through the carrier substrate.

These and other aspects and advantages of the invention will be better understood by reference to the following detailed description taken in conjunction with the accompanying drawings.

BRIEF DESCRIPTION OF THE DRAWINGS

FIG. 1 is a perspective view of a wide-array inkjet pen having a wide-array printhead according to an embodiment of this invention;

FIG. 2 is a planar view of a first side of the wide-array inkjet printhead of FIG. 1;

DESCRIPTION OF SPECIFIC EMBODIMENTS

Overview

FIG. 1 shows a wide-array inkjet pen 10 according to an embodiment of this invention. The pen 10 includes a wide-array printhead 12 and a pen body 14. The pen body 14 serves as a housing to which the printhead 12 is attached. The pen body 14 defines an internal chamber 16 which serves as a local ink reservoir. In various embodiments the reservoir is a replaceable or refillable reservoir. In one embodiment the reservoir is coupled to an external reservoir which supplies the local reservoir. In another embodiment the reservoir is non-refillable.

Figure 4:
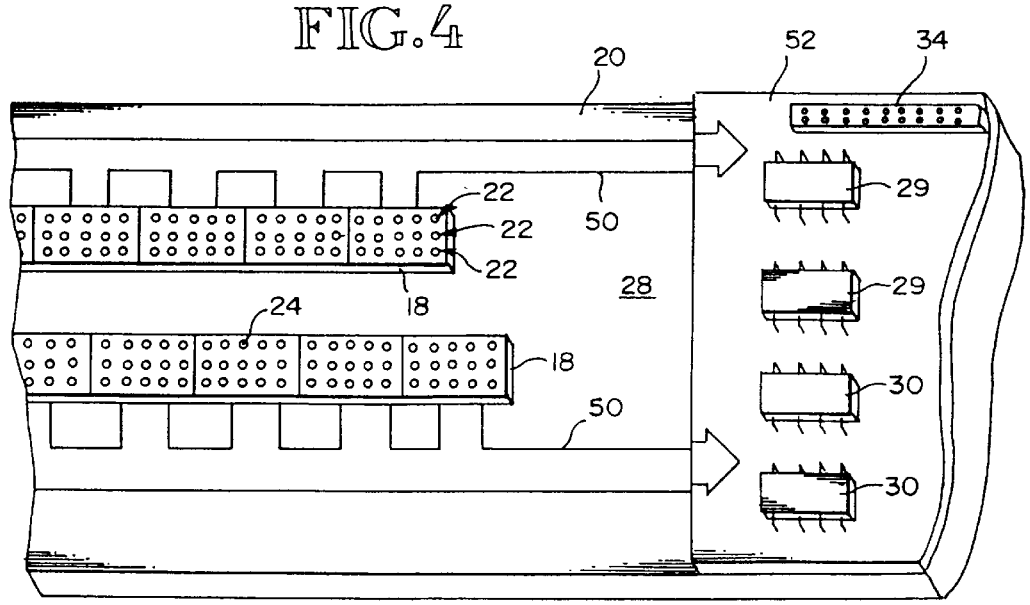
FIG. 4 is a perspective view of an alternative embodiment of the wide-array inkjet printhead of FIG. 1.

Referring to FIGS. 1 and 2, the printhead 12 includes a plurality of thermal inkjet printhead dies 18 mounted to a carrier substrate 20. The printheads dies 18 are aligned in one or more rows 26 on a first surface 28 of the carrier substrate 20. Each one of the printheads dies 18 includes a plurality of rows 22 of inkjet printing elements 24, also referred to as nozzles (see FIG. 4). In the embodiment of FIGS. 1, 2 and 4 the printheads dies 18 are aligned end to end with the respective rows of each printhead die also being aligned.

The carrier substrate 20 is made of silicon or a multilayer ceramic material, such as used in forming hybrid multichip modules. The substrate 20 preferably has a coefficient of thermal expansion matching that of silicon, is machinable to allow formation of an ink slot, is able to receive solder and interconnect layers, and is able to receive mounting of integrated circuits.

Figure 5:
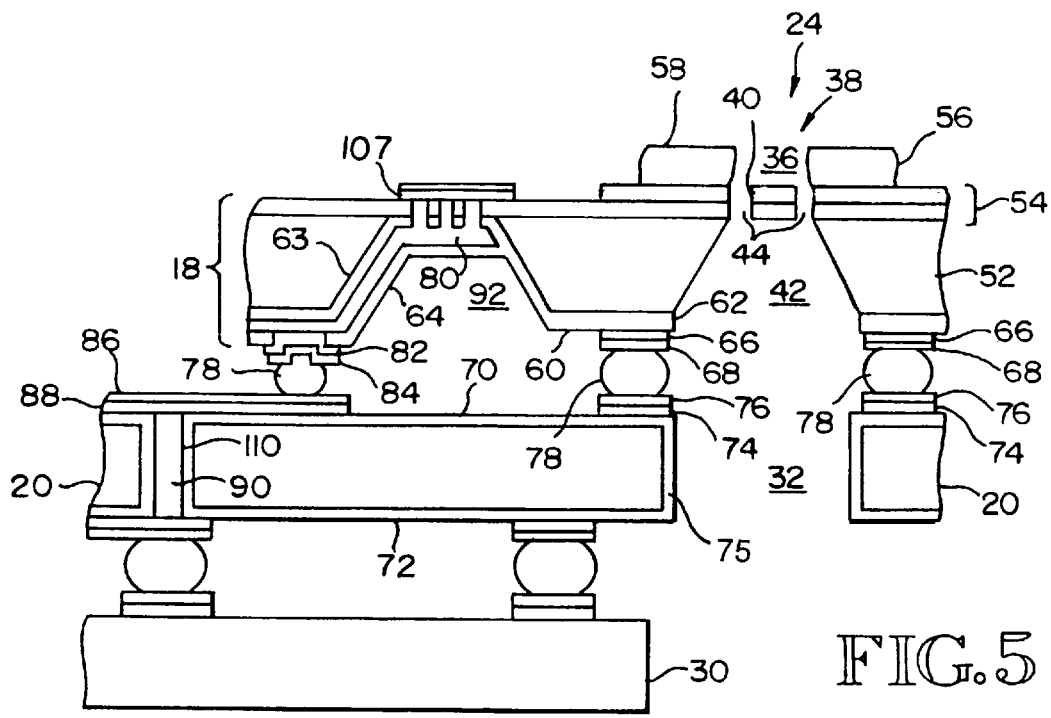
FIG. 5 is a cross-sectional view of a portion of the wide-array inkjet printhead and carrier substrate of FIG. 1.
Figure 6:
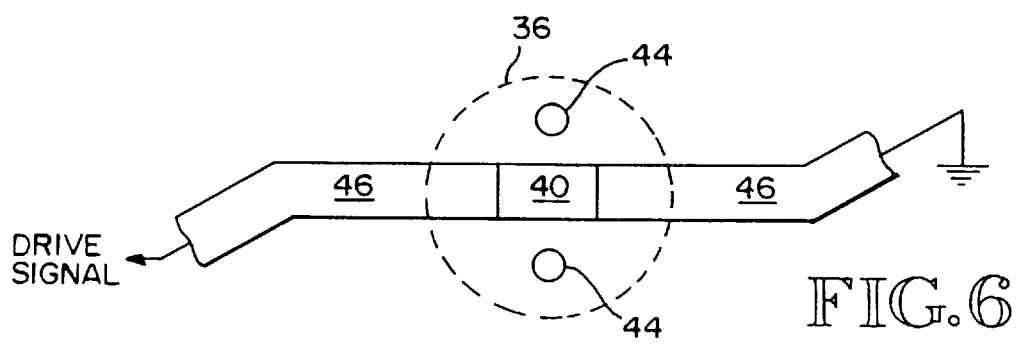
FIG. 6 is a diagram of a wiring line and firing resistor layout for a printing element.

Each printhead die 18 includes an array of printing elements 24. Referring to FIG. 5, each printing element 24 includes a nozzle chamber 36 having a nozzle opening 38. A firing resistor 40 is located within the nozzle chamber 36. Referring to FIG. 6 wiring lines 46 electrically couple the firing resistor 38 to a drive signal and ground. Referring again to FIG. 5, each printhead die 18 also includes a refill slot 42. Ink flows from the internal reservoir within chamber 16 through one or more carrier substrate refill channels 32 to the refill slots 42 of the printhead die 18. Ink flows through each printhead refill slot 42 into the printhead nozzle chambers 36 via ink feed channels 44.

In one embodiment one or more of the printhead dies 18 is a fully integrated thermal inkjet printhead formed by a silicon die 52, a thin film structure 54 and an orifice layer 56. In an exemplary embodiment, the silicon die 52 is approximately 675 microns thick. Glass or a stable polymer are used in place of the silicon in alternative embodiments. The thin film structure 54 is formed by one or more passivation or insulation layers of silicon dioxide, silicon carbide, silicon nitride, tantalum, poly silicon glass, or another suitable material. The thin film structure also includes a conductive layer for defining the firing resistor 40 and the wiring lines 46. The conductive layer is formed by aluminum, gold, tantalum, tantalum-aluminum or other metal or metal alloy. In an exemplary embodiment the thin film structure 54 is approximately 3 microns thick. The orifice layer 56 has a thickness of approximately 7 to 30 microns. The nozzle opening 38 has a diameter of approximately 10–50 microns. In an exemplary embodiment the firing resistor 40 is approximately square with a length on each side of approximately 10–30 microns. The base surface of the nozzle chamber 36 supporting the firing resistor 40 has a diameter approximately twice the length of the resistor 40. In one embodiment a 54.7° etch defines the wall angles for the opening 38 and the refill slot 42. Although exemplary dimensions and angles are given such dimensions and angles may vary for alternative embodiments.

In an alternative embodiment one or more of the printhead dies 18 is formed by a substrate within which are formed firing resistors and wiring lines. A barrier layer overlays the substrate at the firing resistors. The barrier layer has openings which define nozzle chambers. An orifice plate or flex circuit overlays the barrier layer and includes the nozzle openings. An ink refill slot is formed in the substrate by a drilling process.

Figure 3:
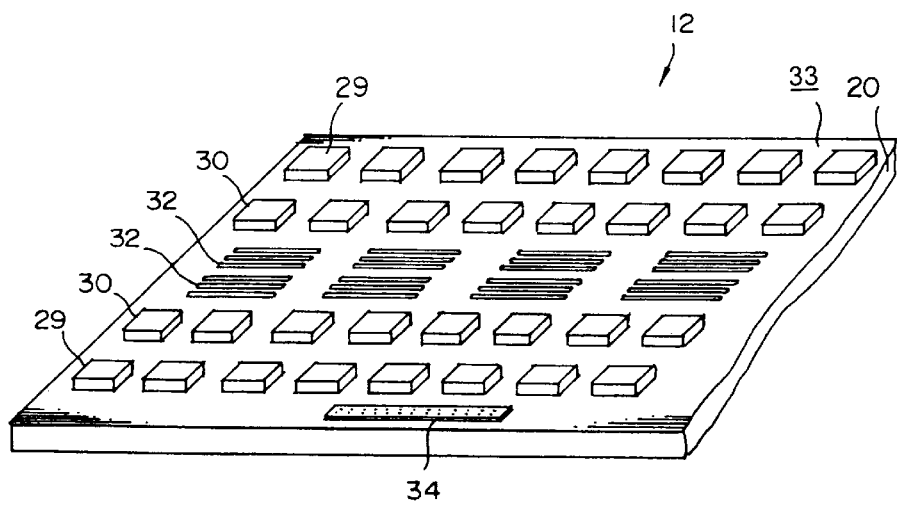
FIG. 3 is a perspective view of a second side of the wide-array inkjet printhead of FIG. 1 opposite the first side.

Upon activation of a given firing resistor 40, ink within the surrounding nozzle chamber 36 is ejected through the nozzle opening 38 onto a media sheet. Referring to FIGS. 2–4 logic circuits 29 select which firing resistors 40 are active at a given time. Drive circuits 30 supply a given drive signal to a given firing resistor 38 to heat the given firing resistor 38. In one embodiment the logic circuits 29 and drive circuits 30 are mounted to the carrier substrate 20. In an alternative embodiment the logic circuitry and drive circuitry are located off the wide-array printhead structure 12. Referring to FIGS. 2 and 3, the logic circuits 29 and drive circuits 30 are mounted to a second surface 33 of the substrate 20, opposite the first surface 28 in an exemplary embodiment. In another exemplary embodiment (see FIG. 4) the logic circuits 29 and drive circuits 30 are mounted to the same surface 28 as the printhead dies 18. Referring to FIG. 3, the carrier substrate 20 includes interconnects 50 fabricated or applied to the substrate 20. The printhead dies 18 are mounted to the carrier substrate into electrical contact with respective interconnects 50. In a preferred embodiment there is an interconnect 50 for each electrical contact of each printhead die 18. The printhead die 18 includes a plurality of contacts for coupling the printing element wiring lines 46 to respective drive signals. The interconnects 50 extends to the drive circuits 30 which source the drive signals. In one embodiment a daughter substrate 52 is mounted to the carrier substrate. The logic circuits 29 and drive circuits 30 are mounted to such daughter substrate. The daughter substrate interconnects the logic circuits 29 and drive circuits 30 to each other, and interconnects the drive circuits 30 to the carrier substrate interconnects 50. In an alternative embodiment the logic circuits 29 and drive circuits 30 are mounted directly to the carrier substrate 20.

During operation, the wide-array printhead 12 receives printer control signals from off the substrate 20. Such signals are received onto the substrate 20 via a connector 34. The logic circuits 29 and drive circuits 30 are coupled directly or indirectly to such connector 34. The printhead die 18 are coupled to the drive circuits 30.

Method of Mounting the Printheads

Each printhead die has a first surface 58 and a second surface 60, opposite the first surface 58. The nozzle openings 38 occur in the first surface 58. Ink refill slots 42 occur in the second surface 60. The silicon die 52 has one or more dielectric layers 62 (e.g., nitride or carbide layers) at the second surface 60. During fabrication of the printhead die 18 an interconnect metal 66 and a wetting metal 68 are deposited onto the second surface 60 at prescribed locations. The interconnect metal is deposited onto the dielectric layer(s) 62, and the wetting metal is applied onto the interconnect metal. In one embodiment photolithographic processes are used to define a precise location, size and shape of the wetting metal 68. Such processes enable accurate placement of the wetting metal to within 1 micron.

The carrier substrate 20 also includes a first surface 70 and a second surface 72 opposite the first surface 70. The printhead die 18 is mounted to the carrier substrate 20 with the printhead second surface 60 facing the carrier substrate 20 as shown in FIG. 5. The spacing between the printhead die 18 and carrier substrate 20 is exaggerated for purposes of illustration. Like the printhead dies 18, a dielectric layer 75 (e.g., nitride layer) is applied to the surfaces 70, 72, and an interconnect metal 74 and wetting metal 76 (also referred to herein as metal pads or wetting pads) are deposited onto the nitride layer 72 at prescribed locations. In one embodiment photolithographic processes are used to define a precise location, size and shape of the wetting metal 68. Such processes enable accurate placement of the wetting metal to within 1 microns. In preferred embodiments the wetting metals 76 are on the substrate 20 are formed in locations corresponding to the wetting metals 66 of the printheads. Specifically, there is a one to one correspondence between the wetting metal locations on the carrier substrate 20 and the printhead dies 18.

Solder bumps are deposited onto the wetting metal of either the printhead die 18 or carrier substrate 20. To mount a printhead die 18, the printhead die 18 is pressed to the carrier substrate so that the wetting metals of each line up. The wetting metals 68, 76 are separated by the solder bumps 78. The solder is then heated liquefying the solder. The solder then flows along the wetting pads 68, 76 and pulls the printhead die 18 into precise alignment with the carrier substrate 20. More specifically the solder 78 pulls the printhead wetting pad 68 into precise alignment with the corresponding carrier substrate metal pad 76. It has been demonstrated that solder reflow forces align the respective wetting metals 68, 76 to within 1 micron. Thus, it is by precisely locating the wetting metals 68, 76 using the photolithographic and other deposition processes, that the printhead dies 18 are able to be precisely placed and aligned on the carrier substrate 20 to within desired tolerances.

According to an aspect of the invention, the solder also forms a fluid barrier. As described above the printheads include one or more refill slots 42 and the carrier substrate includes one or more refill channels 32. Each refill slot 42 is to be in fluidic communication with a refill channel 32. As shown in FIG. 5 the refill slot 42 is aligned to the refill channel 32. To prevent ink from leaking at the interface between the printhead die 18 and the carrier substrate 20, a seal is to be formed. In one embodiment the solder 78 is corrosive resistant and serves as the seal. Specifically the wetting metal 68, 76 are deposited around the respective openings of the refill slot 42 and refill channel 32. Thus, when solder is applied to mount the printhead die 18 to the substrate 20, the solder defines a seal or fluidic barrier which prevents ink from leaking at the interface. In alternative embodiments an underfill process is performed in which an adhesive or a sealant is used to form a fluidic barrier.

Interconnect Method Coupling Printhead and Carrier Substrate

Figure 8:
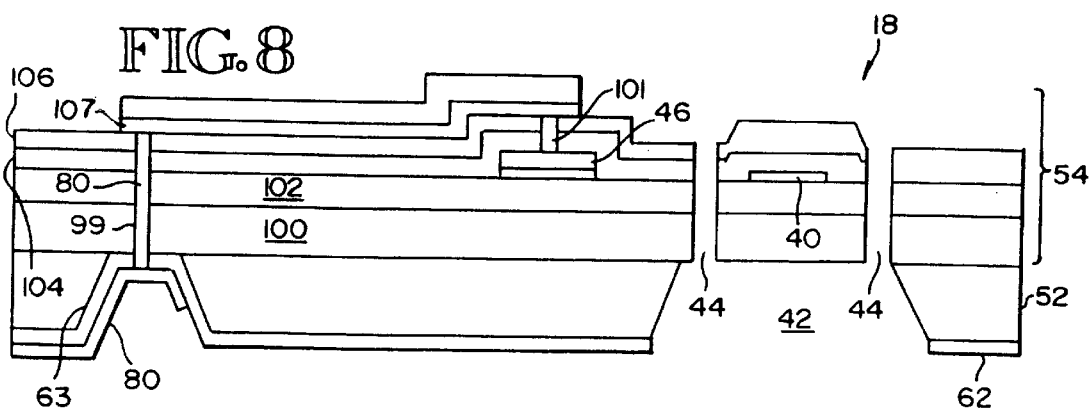
FIG. 8 is a cross-sectional view of the printhead of FIG. 7 in a later stage of being fabricated.

As described above, the printing elements 24 with wiring lines 46 are formed toward the first surface 58 of the printhead. Because the carrier substrate is adjacent to the second surface 60 of the printhead die 18, an electrical interconnect is to extend from the first surface 58 to the second surface 60 of the printhead die 18. FIG. 5 shows an embodiment in which an interconnect 80 extends from the thin film structure 54 adjacent the first surface 58 through the silicon die 52 toward the second surface 60. An electrical connection extends from a wiring line 46 through a via 101 to a conductive trace 107 to via 99 and interconnect 80 (as shown in FIG. 8). The interconnect 80 connects to an interconnect metal layer 82 and a wetting metal layer 84 at the second surface 60. Solder 78 then completes the electrical connection to an interconnect 90 at the carrier substrate. A wetting metal layer 86 and an interconnect metal 88 are located on the carrier substrate between the solder 78 and the interconnect 90. In the embodiment shown the interconnect 90 extends through the carrier substrate to an interface with a drive circuit 30. In another embodiment the interconnect 90 extends along a first surface 70 of the carrier substrate to an interface with a drive circuit 30. For drive circuits 30 mounted to the second surface 72 of the substrate 20, a solder connection also is established, although an alternative electrical coupling scheme may be used.

Figure 7:
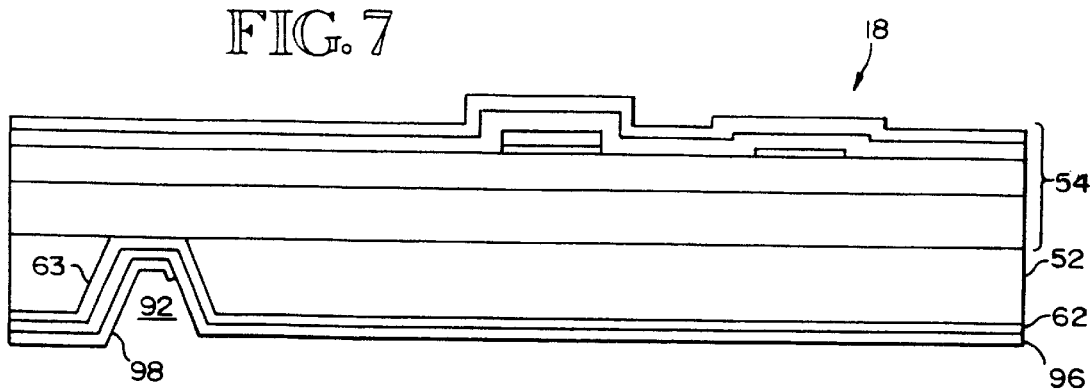
FIG. 7 is a cross-sectional view of the printhead of FIG. 5 while in the process of being fabricated.

To form the interconnect 80 extending through the printhead 18 a trench 92 is etched in the underside (e.g., second surface 60) of the die 52 for one or more interconnects 80. In one embodiment a tetramethyl ammonium hydroxide etch is performed. A hard mask covers portions of the die 52 undersurface not to be etched. The hard mask is then removed by wet etching. A plasma carbide or nitride layer 62 and an Au/Ni/Au layer 96 are deposited on the undersurface as shown in FIG. 7. A photosensitive polyamide layer or an electroplating photoresist 98 is applied over a portion of the Au/Ni/Au layer 96 to define where the metal is to remain for the interconnect 80. The Au/Ni/Au layer 96 then is wet etched and the polyamide or photoresist 98 removed to define the interconnect 80. To protect the Au/Ni/Au during etching of the refill slot 42, a plasma oxide (not shown) then is deposited. The plasma oxide and the carbide or nitride layer 62 then are patterned to define a window to etch the refill slot 42. The refill slot 42 and the feed channels 44 then are etched. Referring to FIG. 8 at a next step one or more vias 99 are cut through passivation layers 100, 102, 104 and a carbide layer 106 of the thin film structure 54 and the carbide or nitride layer 62. The vias 99 extend from the interconnect 80 to the in-process upper surface. A via 101 also is cut to expose a portion of a wiring line 46. Metal then is deposited in the vias 99, 101. Next, a conductive trace 107 (see FIG. 8) is conventionally deposited, photolithographically patterned, and etched onto a layer of the thin film structure 54 to electrically couple the wiring line 46 and the interconnect 80. The second dielectric layer 64 (e.g., nitride layer) then is deposited (see FIG. 5). A polyamide or electroplating photoresist process then is performed to mask the layer 64 and form an opening in the layer 64 to expose a portion of the interconnect 80 (see FIG. 5). The interconnect metal 82 and wetting metal 84 then are deposited onto the exposed portion of the interconnect 80 and patterned and etched in manner similar to that used for other films on the second surface. The interconnect 80 as fabricated extends from a wiring line 46, through the carrier substrate 20, along a trench 92 to an interconnect metal 82 and wetting metal 84 at a second surface 60 of the printhead die 18. Thereafter the thin film structure is completed and the orifice layer 56 is applied.

Figure 9:
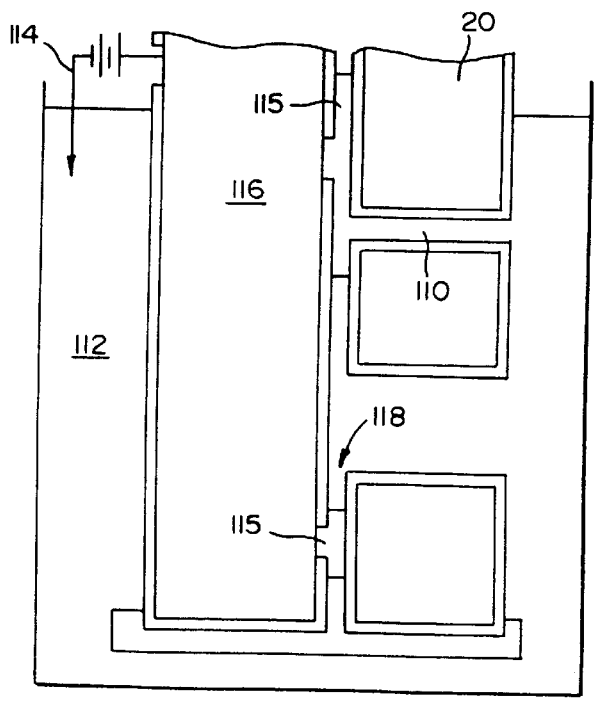
FIG. 9 is a diagram of a substrate in the process of metallizing a through opening to serve as an interconnect.

Method of Fabricating Through-Interconnects and Refill Slot in Carrier Substrate Referring again to FIG. 5, the carrier substrate 20 includes an interconnect 90 extending from one surface of the substrate to the opposite surface of the substrate. In one embodiment the interconnect 90 is formed as described above for the printhead die by etching a trench and depositing the interconnect metal. In an alternative embodiment a straight etch is performed to define a through-opening 110 in the substrate 20. An electroplating method then is performed to fill the etched through-opening 110 with metal. The metal defines the interconnect 90. Referring to FIG. 9, to plate the through-opening 110, the substrate 20 is dipped into a plating solution 112. A bias signal 114 is applied to an electroplate 116 to which the substrate 20 is attached. The electroplate 116 is formed so that a bias current does not flow in the region of the ink refill channel 32 of the substrate. More specifically, a metal layer 115 forms a contact between the substrate 20 and electroplate 116 at desired locations. Thus, the refill channel 32 is not electroplated. In addition, only a small gap 118 occurs between the substrate 20 and the electroplate. This prevents electroplating the undersurface 72 of the substrate 20 while dipped in the plating solution 112.

Alternative Interconnect Method Coupling Printhead and Carrier Substrate

Figure 10:
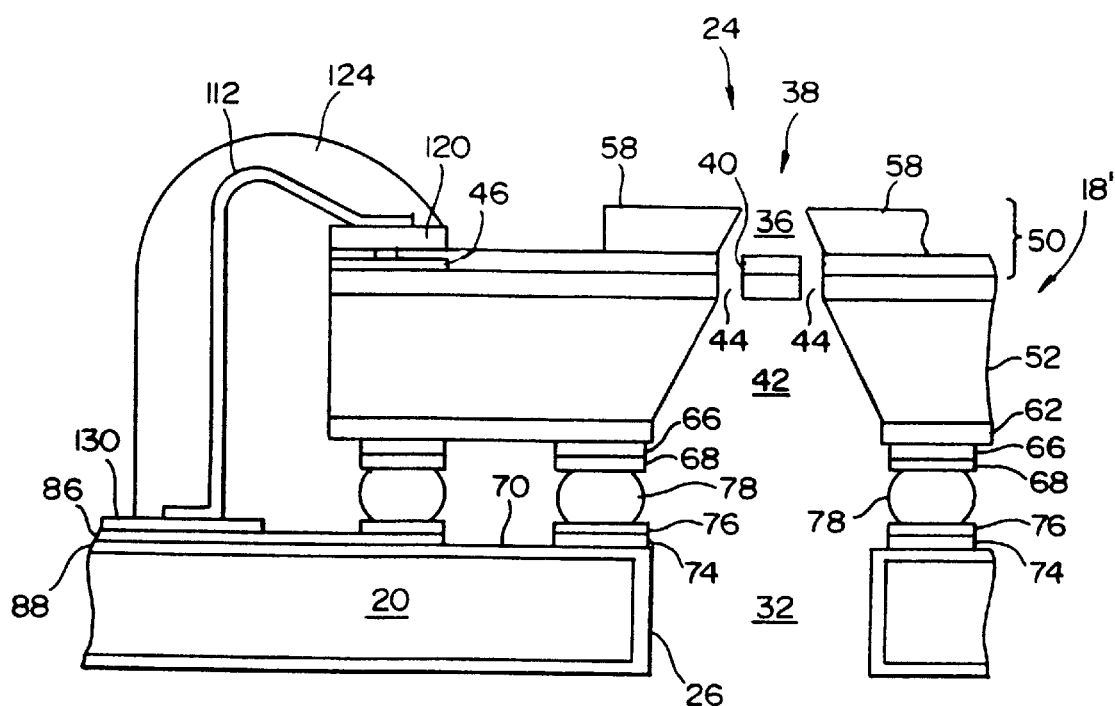
FIG. 10 is a cross-sectional view of a portion of a wide-array inkjet printhead and carrier substrate according to an alternative interconnection scheme.

Rather than form an interconnect extending through the die 52 of the printhead die 18, in an alternative embodiment a wire bond is formed external to the printhead. Referring to FIG. 10, a printhead die 18' is shown with like parts given like numbers. Respective wiring lines 46 for each printing element 24 extend to respective contacts 120. The contact 120 is located on the same side of the printhead die 18' as the nozzle openings 38. A wire 122 is bonded to a contact 120 on the printhead die 18' and a contact 130 on the substrate 20. The contact 130 is located on a surface 70 of the substrate 20. The wire 122 extends outside of the printhead 18' between the printhead die 18' and substrate 20. The wire 122 is affixed to the contacts 120, 130 An encapsulant is applied around the wire 122 to seal the wire and protect it from breaking away from the printhead die 18' or substrate 20. The substrate 20 includes a refill channel 32 through which ink flows toward the printhead die 18. Although such channel is shown as a straight etched channel the walls of the channel alternatively are etched at an angle, (e.g. 54.7°).

Meritorious and Advantageous Effects

One advantage of the invention is that a scalable printhead architecture is achieved wherein different numbers of printhead dies are attached to a carrier substrate to define the size of the printhead.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A wide-array inkjet pen, comprising:

a carrier substrate having a plurality of ink refill slots formed as through-openings in the substrate, said carrier substrate further comprising a plurality of substrate wetting pads disposed at a first side of said carrier substrate;

a plurality of inkjet printhead dies mounted to said first side of said carrier substrate in at least one row, at least one printhead die of said plurality of printhead dies comprising an array of printing elements and an ink refill channel, each printing element of said array of printing elements comprising a nozzle chamber, a firing resistor within said nozzle chamber, a feed channel coupled to said nozzle chamber, and a wiring line coupled to said firing resistor, wherein for said at least one printhead die, an ink flow path is formed from one of said plurality of ink refill slots through said ink refill channel and through each feed channel of each printing element of said array of printing elements, and into said nozzle chamber of each printing element of said array of printing elements, wherein each printhead die of said plurality of printhead dies aligned in said at least one row is aligned end to end, said nozzle openings of said each printhead die of said plurality of printhead dies aligned in at least one common row of nozzle openings, said at least one of said plurality of printhead dies further comprising a die wetting pad wherein said substrate wetting pad and said die wetting pad are precisely positioned in alignment to affix said at least one of said plurality of printhead dies to said carrier substrate during a solder reflow operation and wherein for said at least one of said plurality of printhead dies, solder forms a fluidic boundary for said ink flow path between said at least one printhead die and said carrier substrate;

a plurality of drive circuits mounted to a second side of said carrier substrate, wherein said second side is opposite said first side, wherein said wiring line of said each printing element is electrically coupled to a corresponding drive circuit of said plurality of drive circuits; and a plurality of logic circuits mounted to said second side of said carrier substrate, said plurality of logic circuits electrically coupled to said drive circuits, wherein said plurality of logic circuits receive control signals and in response generate output signals to multiple drive circuits for selecting printing elements which are to fire.

2. The pen of claim 1, wherein a plurality of interconnects are formed through said carrier substrate between said first side and said second side, wherein said wiring line of said each printing element is electrically coupled to said corresponding drive circuit of said plurality of drive circuits through a corresponding interconnect of said plurality of interconnects.

3. The pen of claim 2, wherein each printhead die of said plurality of printhead dies includes a first face located toward the carrier substrate and a second face located away from the carrier substrate, wherein the nozzle opening for each printing element of each printhead die of said plurality of printhead dies is along said second face of said each printhead die, and wherein each one of the plurality of printhead dies further comprises a plurality of contacts at said second face, wherein said plurality of interconnects are a plurality of first interconnects, and wherein said at least one printhead die further comprises a plurality of second interconnects extending from said plurality of contacts of said at least one printhead die through said at least one printhead die into electrical contact with an interconnect of said plurality of first interconnects formed through the carrier substrate.

4. The pen of claim 1, wherein said carrier substrate comprises silicon and each of said plurality of printhead dies comprises silicon.

5. The pen of claim 1, wherein said carrier substrate comprises a multilayered ceramic and each of said plurality of printhead dies comprises silicon.

6. A wide-array inkjet pen, comprising:

a carrier substrate having a plurality of ink refill slots;

a plurality of printhead dies mounted by solder to a first side of said carrier substrate in at least one row, at least one printhead die comprising an array of nozzle chambers, an array of firing resistors and an ink refill channel that is in fluid communication with said array of nozzle chambers and at least one of said plurality of ink refill slots, wherein said solder forms a fluidic boundary around an ink flow path between said at least one printhead die and said carrier substrate, wherein each firing resistor of said array of firing resistors is located in a corresponding nozzle chamber of said array of nozzle chambers, wherein said at least one printhead die is aligned in said at least one row end to end with another printhead die of said plurality of printhead dies, said firing resistors of said at least one printhead die being aligned in at least one common row of firing resistors;

a plurality of drive circuits disposed on a second side of said carrier substrate and electrically coupled to said plurality of printhead dies; and a plurality of logic circuits disposed on a second side of said carrier substrate and electrically coupled to said drive circuits, wherein said logic circuits receive control signals and in response generate output signals to multiple drive circuits coupled to said array of firing resistors for selecting firing resistors which are to fire.

7. The pen of claim 6, wherein a plurality of interconnects are formed through the carrier substrate, wherein said array of firing resistors of said one printhead die is electrically coupled to said drive signal source through a corresponding interconnect of said plurality of interconnects.

8. The pen of claim 7, wherein each one printhead die further comprises an array of nozzle openings, each one nozzle opening of the array of nozzle openings leading to a corresponding nozzle chamber of the array of nozzle chambers, each one printhead die of said plurality of printhead dies including a first face located toward the carrier substrate and a second face located away from the carrier substrate, wherein the array of nozzle openings occur along the second face of said each one printhead die, and wherein each one of the plurality of printhead dies further comprises a plurality of contacts at said second face, wherein the plurality of interconnects are a plurality of first interconnects, and wherein each one of the plurality of printhead dies further comprises a plurality of second interconnects extending from a respective one of the plurality of contacts through said one printhead die into electrical contact with an interconnect of the plurality of first interconnects formed through the carrier substrate.

9. The pen of claim 6, wherein a first ink refill slot of the plurality of ink refill slots and an ink refill channel of a first printhead die of the plurality of printhead dies are aligned to form a first section and a second section of an ink flow path, solder joining the first section and second section of the ink flow path, the solder being sandwiched between said first printhead die and the carrier substrate.

10. A thermal inkjet pen, comprising:

a carrier substrate having a surface, the surface including a refill slot;

a printhead substrate having a surface defining an ink refill channel, the ink refill channel receiving ink from the refill slot;

wherein the ink refill slot and the ink refill channel are aligned to form a first section and a second section of an ink flow path, the pen further comprising solder joining the first section and second section of the ink flow path, the solder being sandwiched between the printhead substrate and the carrier substrate, so as to form a fluidic boundary for said ink flow path between said carrier substrate and said printhead substrate.

11. The thermal inkjet pen of claim 10, wherein the carrier substrate further comprises associated circuitry for providing drive signals to the printhead substrate and solder connections that connect the associated circuitry to the printhead substrate.

12. The pen of claim 10, in which the carrier substrate comprises a plurality of substrate wetting pads around the ink refill slot, in which the printhead substrate comprises a plurality of printhead wetting pads around the ink refill channel, and wherein the substrate wetting pads and printhead wetting pads are precisely positioned in alignment, and wherein the printhead substrate conforms to the wetting pad alignment in response to solder reflow forces aligning the ink refill channel and the ink refill slot.

13. The pen of claim 10, in which the solder is located between a first surface of the printhead substrate and an opposing, parallel surface of the carrier substrate.

* * * * *